(12) United States Patent
Sun et al.

(10) Patent No.: US 10,018,794 B2
(45) Date of Patent: Jul. 10, 2018

(54) OPTICAL MODULE AND MANUFACTURING METHOD THEREOF

(71) Applicant: InnoLight Technology (Suzhou) Ltd., Suzhou, Jiangsu (CN)

(72) Inventors: Yuzhou Sun, Jiangsu (CN); Zhenzhong Wang, Jiangsu (CN); Dengqun Yu, Jiangsu (CN); Yonggan Zhang, Jiangsu (CN); Jiang Chang, Jiangsu (CN); Xiangzhong Wang, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 16 days.

(21) Appl. No.: 15/087,850

(22) Filed: Mar. 31, 2016

(65) Prior Publication Data

US 2016/0291272 A1    Oct. 6, 2016

(30) Foreign Application Priority Data

Apr. 1, 2015  (CN) .......................... 2015 1 0150056

(51) Int. Cl.
  *G02B 6/42* (2006.01)
  *H05K 3/46* (2006.01)

(52) U.S. Cl.
  CPC ......... *G02B 6/4281* (2013.01); *G02B 6/4204* (2013.01); *G02B 6/4237* (2013.01); *G02B 6/4251* (2013.01); *H05K 3/4691* (2013.01); *H05K 2201/10121* (2013.01)

(58) Field of Classification Search
  CPC .................................................. G02B 6/4251
  See application file for complete search history.

(56) References Cited

U.S. PATENT DOCUMENTS

| | | | |
|---|---|---|---|
| 9,548,817 B1* | 1/2017 | Nagarajan | H04B 10/501 |
| 2009/0002959 A1* | 1/2009 | Loibl | H01R 13/5202 361/749 |
| 2009/0092274 A1* | 4/2009 | Song | H04R 19/016 381/369 |
| 2009/0161252 A1* | 6/2009 | Okinaga | G11B 17/0284 360/99.08 |
| 2012/0128290 A1* | 5/2012 | Han | G02B 6/4206 385/14 |
| 2012/0128300 A1* | 5/2012 | Ban | G02B 6/421 385/33 |
| 2013/0272663 A1* | 10/2013 | Katou | G02B 6/42 385/88 |
| 2015/0373854 A1* | 12/2015 | Ikemoto | H04N 5/2257 361/767 |
| 2016/0154177 A1* | 6/2016 | Han | G02B 6/4251 385/14 |

* cited by examiner

*Primary Examiner* — Jerry Rahll
(74) *Attorney, Agent, or Firm* — Finnegan, Henderson, Farabow, Garrett & Dunner, LLP

(57) ABSTRACT

An optical module may include a case, an optical assembly, a circuit board interface positioned on the case, and a circuit board attached to the case through the circuit board interface. The optical assembly may be arranged in the case. The circuit board may include a first area that may electrically connect the circuit board to the optical assembly. The circuit board may also include a second area that may secure the circuit board to the circuit board interface. An optical module manufacturing method is also provided.

7 Claims, 11 Drawing Sheets

OPTICAL MODULE AND MANUFACTURING METHOD THEREOF

CROSS-REFERENCE TO RELATED APPLICATION

This application claims the benefit of priority to Chinese Application No. CN 201510150056.X, filed Apr. 1, 2015.

FIELD OF THE DISCLOSURE

This present disclosure relates to optical communication component manufacturing, and more specifically, an optical module and manufacturing method thereof.

BACKGROUND

In manufacturing optical modules, the photoelectric component, chip, and other components of the optical module may need to be packaged airtight to provide protection for the internal components and chip and to help ensure stable performance of the device.

Airtight packaging may mainly use glass, metal, and ceramic packages, which may be expensive. Metal and ceramics may be used in combination to provide airtight packaging, as shown in FIG. 1, where a metal case 200 and a ceramic part 300 are used. This technique can be complex and have a high cost. Additionally, the ceramic part 300 may need to be welded to a flexible circuit board 400, which can damage the pathway of a high-speed link layer 500, and in turn may affect the high-speed performance of the high-speed link layer 500. In addition, as the use of chip control signals increase, the positions where devices are placed may be under optical impact, and high-speed signals may need an unbroken reference ground; otherwise, issues such as electromagnetic radiation and completeness of signals may arise. Finally, the high-speed link layer 500 may need a multilayer flexible circuit board design, but too many layers may affect its flexibility, which in turn may affect its use.

SUMMARY

Embodiments of the present disclosure may provide an optical module that can reduce the level of difficulty in the technique and reduce the cost of manufacturing. According to embodiments of the present disclosure, an optical module may include a metal case, an optical assembly packaged within the metal case, a circuit board interface, and a circuit board, wherein the circuit board interface opening may be on the metal case. The circuit board may be inserted and connected to the inside of the metal case through the circuit board interface. The circuit board may be electrically connected to the optical assembly. The circuit board interface may be secured to the circuit board by welding.

In one embodiment, there may be a metal layer on the portion of the circuit board that corresponds to the circuit board interface, and the circuit board interface may be welded to the metal layer.

In one embodiment, the circuit board may be a combination of a flexible board and a rigid board. The flexible board of the circuit board may go through the circuit board interface and may be welded to the circuit board interface, and the rigid board of the circuit board may be connected to the flexible board outside of the metal case.

In one embodiment, there may be at least one reinforcing layer on the portion of the circuit board that corresponds to the circuit board interface, and the circuit board interface may be seal welded to the reinforcing layer.

In one embodiment, a first reinforcing layer connected to the circuit board interface may be set on the upper surface of the flexible board of the circuit board, the rigid board of the circuit board may be set on the lower surface of the flexible board of the circuit board, and the upper surface of the flexible board may be a high-speed link layer for high-speed signal transmission.

In one embodiment, there may be a second reinforcing layer connected to the circuit board interface on the portion of the lower surface of the flexible board of the circuit board that corresponds to the first reinforcing layer.

In one embodiment, the first reinforcing layer and/or the second reinforcing layer may be rigid boards connected to the flexible board, and a metal layer may be set on the portions of the first reinforcing layer and/or the second reinforcing layer that connect to the circuit board interface for welding onto the metal case.

In one embodiment, there may be adhesive sealant where the circuit board connects with the circuit board interface.

In one embodiment, the metal case may comprise an upper part and a lower part, and the upper part of the metal case and the lower part of the metal case may be sealed together.

Embodiments of the present disclosure provide a manufacturing method for an optical module. The method may include welding the circuit board to the lower part of the metal case, adhering the optical assembly to the lower part of the metal case, connecting the optical assembly to the circuit board, welding the upper part of the metal case to the circuit board, and securing the upper part of the metal case and the lower part of the metal case.

Embodiments of the present disclosure may lower the difficulty and cost of manufacturing by using the metal case to package the optical assembly and part of the circuit board.

DETAILED DESCRIPTION

Figure 1:
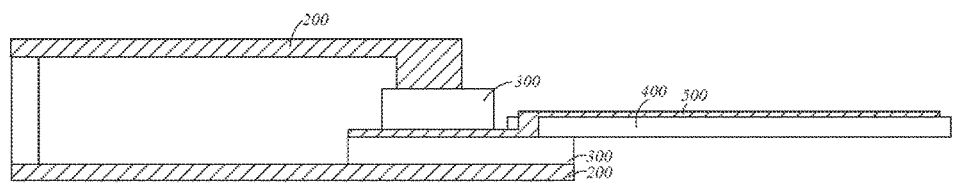
FIG. 1 shows a structural schematic diagram of a prior art optical module.

The present disclosure provides descriptions of embodiments as shown in the drawings. However, these embodiments do not limit the application. The scope of protection for the present disclosure covers changes made to the structure, method, or function by one of ordinary skill based on the embodiments.

In all figures of the present disclosure, for the purpose of illustration, the sizes of some structures or portions are enlarged relative to other structures or portions; therefore, they are only used to illustrate the basic structures in connection with embodiments of the present disclosure.

In addition, the terminology in the present disclosure that expresses relative spatial positions, such as "above", "over", "below", and "under", are used for ease of explanation as they describe the relative relationship of one unit or feature to another unit or feature as shown in the attached drawings. The terminology expressing relative spatial positions can be intended to include positions other than the ones shown in the figures when the device is in use or operation. For example, if the device in a figure is turned upside down, a unit described as "below" or "under" another unit or feature will now be "above" this other unit or feature. Therefore, the exemplary term "under" can cover two positions: above and below. The device may be oriented in other ways (turned 90° or toward another direction), and the terminology used in the present disclosure that is relevant to space should be interpreted accordingly.

Figure 2:
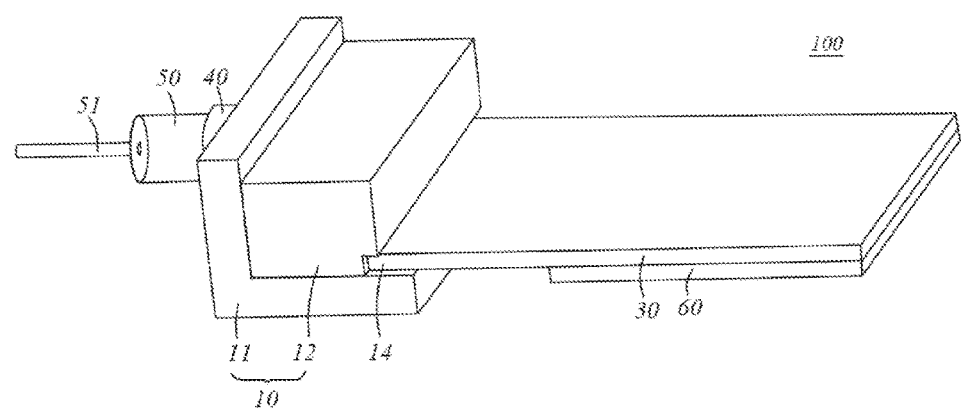
FIG. 2 shows a structural schematic diagram of the optical module according to an embodiment of the present disclosure.
Figure 3:
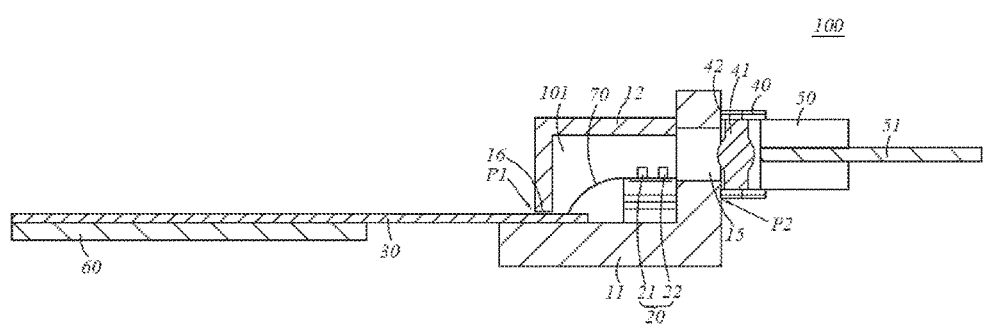
FIG. 3 shows a cross-sectional-view schematic diagram of the optical module according to an embodiment of the present disclosure.

FIG. 2 and FIG. 3 show an embodiment of optical module 100 according to the present disclosure. In this embodiment, the optical module 100 comprises a metal case 10, an optical assembly 20, and a circuit board 30.

The optical assembly 20 is packaged in the metal case 10. It should be noted that the optical module 100 of the present disclosure can be a number of things, for example: a transmitter optical sub-assembly (TOSA), in which case the optical assembly 20 may comprise a semiconductor laser diode (LD); a receiver optical sub-assembly (ROSA), in which case the optical assembly 20 may comprise a photodiode (PD) 21; or, something that can serve both as a transmitter and a receiver, in which case the optical assembly 20 may comprise a semiconductor laser diode 22 and a photodiode 21 at the same time. In the present disclosure for this embodiment, the example taken for the narrative is an optical assembly 20 comprising a semiconductor laser diode 22 and a photodiode 21 in the optical module 100, but this does not limit the type of the optical assembly described in the present disclosure. Optionally or additionally, the optical module 100 may be suitable for the transmission and reception of optical signals at various data transfer rates, including, for example, 1 gigabit (Gbit) per second (Gb/s), 2 Gb/s, 4 Gb/s, 8 Gb/s, 10 Gb/s, 20 Gb/s, 100 Gb/s, or other optical fiber link bandwidths. In addition, optical modules of other types or configurations, or optical modules whose components differ in some aspects from those shown and described here, can also benefit from the described mechanism.

In operation, optical module 100 may receive data-carrying electrical signals from a host computer device and transmit the data to an optical fiber 51 as data-carrying optical signals. The host device can be any computer system that can communicate with the optical module 100. Such electrical signals, for example, can be provided to the semiconductor laser diode 22 packaged in the metal case 10, and the semiconductor laser diode 22 may convert the electrical signals to data-carrying optical signals, for example, for emission into the optical fiber 51 from where they are transmitted via an optical communication network. The semiconductor laser diode 22 may be an edge-emitting semiconductor laser, a Fabry-Perot (FP) laser, a vertical-cavity surface-emitting laser (VCSEL), a distributed feedback (DFB) laser, or other suitable optical sources.

As shown in FIG. 2 and FIG. 3, the metal case 10 may comprise a lower part 11, within which an assembly space 101 is formed. The aforementioned optical assembly 20 is laid out in the assembly space 101. In one embodiment, the upper portion of the lower part of the metal case 11 forms an opening connected to the assembly space 101 (not shown in the figure), and the upper part of the metal case 12 is placed at the opening to seal up the passage through which the assembly space 101 connects to the outside. The upper part of the metal case 12 and the lower part of the metal case 11 can be welded together to secure their positions and provide airtight seal between the assembly space 101 and the outside.

In the manufacturing and production process of the optical module 100, the upper part of the metal case 12 can also be used to allow the assembling and securing of the optical assembly 20, other chips, and other components in the unenclosed assembly space 101 in the metal case 10 before the optical module 100 is fully assembled. This may provide convenience for the repair and maintenance of the optical assembly 20.

Also shown in FIG. 3, a circuit board interface 16 can be set on the metal case 10, and the circuit board 30 may be inserted and connected/attached to the inside of the metal case 10 through the circuit board interface 16. The circuit board 30 can be a flexible circuit board that comprises electrically conductive components and a flexible substrate. Alternatively, circuit board 30 can be a rigid circuit board. Circuit board 30 can also be one or more rigid circuit boards and one or more flexible circuit boards integrated into a combination of flexible boards and rigid boards that is multilayered.

The size of the opening of the circuit board interface 16 may be set so that the circuit board 30 can pass through with relative ease, and the opening is not too big to make the following welding process difficult. Welding tin for sealing (not shown in the figure) can be placed at the circuit board interface 16 to seal the gap P1 between the circuit board interface 16 and circuit board 30. In one embodiment, the welding tin for sealing is added in its melted state to the circuit board interface 16, which seals the circuit board interface 16 when the tin is cooled and hardened. The welding tin for sealing may also provide a stabilizing force that holds the circuit board 30 in place so that the circuit board 30 is secured in its position relative to the metal case 10.

To help ensure adherence between the welding tin for sealing and the metal case 10 and circuit board 30, in this embodiment, the portion of the circuit board 30 that corresponds to the circuit board interface 16 may have a metal layer (for example, it can be a copper sheet, a copper-plated layer, or a gold-plated layer on the circuit board 30), and the corresponding portion of the circuit board interface 16 can be plated with gold or copper. In addition, the portion of the circuit board 30 that corresponds to the circuit board interface 16 can have the metal layer all around so that all four sides can be sealed to achieve good sealing. Adhesive sealant can also be placed where the circuit board 30 connects to the circuit board interface 16 to further improve the sealing. Of course, in alternative embodiments, the portion on the circuit board 30 that is thinned to expose the internal metal medium is not necessarily limited to the portion that corresponds to the circuit board interface 16, and gold, copper, or any other suitable metal or alloy can be placed in a larger area on the metal case 10, for example, around the circuit board interface 16. In this way, the circuit board 30 and metal case 10 can be welded to ensure good airtightness after welding.

The metal case 10 can also comprise an auxiliary welding member (not shown in the figure) extending from the side edge of the circuit board interface 16 to support a portion of the circuit board 30 for stability of the circuit board 30 when the welding tin for sealing is applied to the circuit board interface 16.

Figure 4:
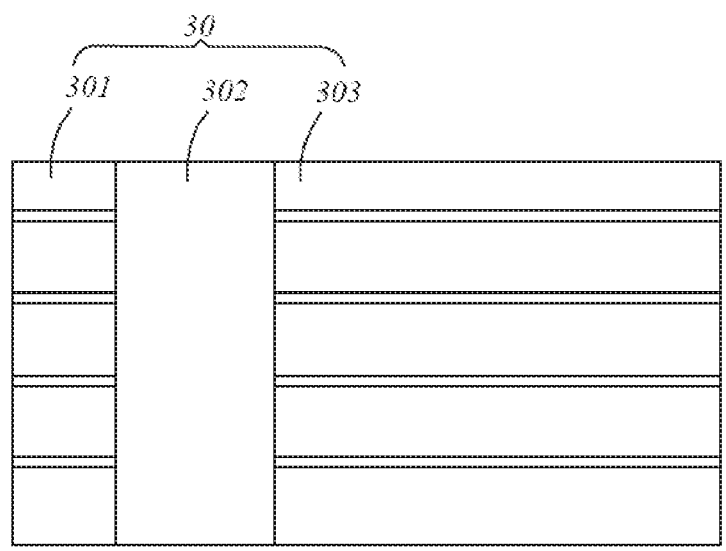
FIG. 4 shows a structural schematic diagram of the circuit board according to an embodiment of the present disclosure.

The circuit board 30 can be a combination of a flexible board and a rigid board. As shown in FIG. 3 and FIG. 4, The flexible board of the circuit board 30 goes through and is welded to the circuit board interface 16, and the rigid board 60 of the circuit board 30 is connected to the flexible board outside of the metal case 10. The circuit board 30 may comprise, in the following order, a first area 301 inside the metal case 10 for connection with the optical assembly 20, a second area 302 for welding to the circuit board interface 16, and a third area 303 outside of the metal case 10 for connection with another part. The rigid board 60 may be connected to the third area 303 on the lower surface of the flexible board of the circuit board 30. Other components such as capacitors, resistors, chips, and other things needed for the operation of the optical transmission and receiving module may also connect to the third area 303. Because the circuit board 30 is a flexible board, the assembly of the rigid board 60 may be convenient.

To help ensure flexibility of the circuit board 30 and in consideration of multilayer routing, an area that may need to be bent may use a structure that provides high flexibility, and the area that may not need to be bent may use a multilayer circuit board structure. Control signals can be transmitted to an inner layer through vias without causing damage to the reference ground of the high-speed signals. Specifically, the first area 301 and the second area 302 can use a multilayer circuit board structure, such as a flexible circuit board, a rigid circuit board, or another reinforcing material. The third area 303 can use a highly flexible structure. In addition, the number of routing layers in the third area 303 can be smaller than the number of routing layers in the first area 301, and at the same time the number of routing layers in the third area 303 can also be smaller than the number of routing layers in the second area 302. Thus, the flexibility of the third area 303 may be improved, and may make it easier for the third area 303 to connect with another part 60, and at the same time may ensure the multilayer design in the first area 301 and the second area 302, which may guarantee smooth transmission of high-speed signals.

In this embodiment, at least the upper surface and lower surface of the second area 302 may have a metal layer for welding to the circuit board interface 16 or sealing to it with adhesive. In other embodiments, reinforcing layers can be placed between the circuit board interface 16 and the upper and lower surfaces of the second area 302. The circuit board interface 16 can be directly welded to the reinforcing layers or sealed to them with adhesive so that the circuit layers on the upper and lower surfaces of the second area 302 are not damaged.

As shown in FIG. 3, a light exit opening 15 corresponding to the optical assembly 20 is set on the metal case 10, corresponding to the semiconductor laser diode 22, to allow optical signals emitted from the semiconductor laser diode 22 to pass through and couple into the optical fiber 51 or another photoelectric part outside of the metal case 10.

The optical module 100 also comprises a metal sleeve tube 40 circularly connected to the light exit opening 15, and a lens 41 is set in the metal sleeve tube 40. The metal sleeve tube 40 and lens 41 can be formed as one piece in a die to ensure the airtightness between the lens 41 and metal sleeve tube 40. The metal sleeve tube 40 may include a connecting surface 42 in its axial direction facing the metal case 10, and at least a portion of the connecting surface 42 may be joined with the metal case 10 around the light exit opening 15. The size of the light exit opening 15 may be designed to be no smaller than the size of the lens 41 in the metal sleeve tube 40. In this embodiment, the light exit opening 15 can be set to be slightly larger than the size of the lens 41 in the metal sleeve tube 40 to ensure better coupling on the optical path. Accordingly, a small portion of the connecting surface 42 of the metal sleeve tube 40 can correspond to where the light exit opening 15 is.

The metal sleeve tube 40 is secured on the metal case 10 by means of welding. For example, the two can be secured by means of laser welding or electric resistance welding. These means of welding may not require the introduction of other welding materials. Instead, the connecting portions of the metal sleeve tube 40 and metal case 10 can be melted and directly welded together. Here the welding position P2 of the metal case 10 and metal sleeve tube 40 may be located at the outer edge of the connecting portion of the metal sleeve tube 40 and metal case 10. The welding position of the metal sleeve tube 40 and metal case 10 can be coated with waterproof adhesive, and the welding position P2 refers to the aforementioned outer edge of the connecting portion of the metal sleeve tube 40 and metal case 10. Once the waterproof adhesive is hardened, it can ensure the stability of the connection between the metal sleeve tube 40 and metal case 10, and it can effectively prevent outside vapor from eroding the welding position P2 or entering into the metal case 10 through the welding position P2.

The optical module 100 also may include an optical fiber sleeve tube 50 inserted into and connected to the metal sleeve tube 40, and the optical fiber sleeve tube 50 may have an optical fiber 51 inside. The optical fiber sleeve tube 50 and optical fiber 51 can be formed as one piece with a die in order to ensure airtightness between the optical fiber 51 and optical fiber sleeve tube 50. The inner diameter of the metal sleeve tube 40 can be set to be slightly larger than the outer diameter of the optical fiber sleeve tube 50 in order to help ensure that the optical fiber sleeve tube 50 can move back and forth in the metal sleeve tube 40 for the purpose of adjusting the position of the optical fiber 51 for better coupling of light into the optical fiber 51. In addition, to maintain better coupling on the path, the optical fiber sleeve tube 50 and metal sleeve tube 40 can be welded and secured to one another once the position adjustment of the optical fiber 51 is completed.

Figure 5:
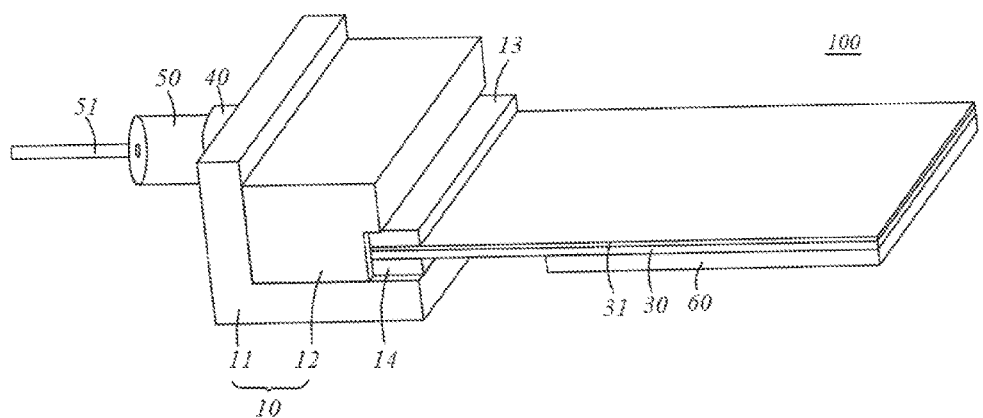
FIG. 5 shows a structural schematic diagram of the optical module according to an embodiment of the present disclosure.
Figure 6:
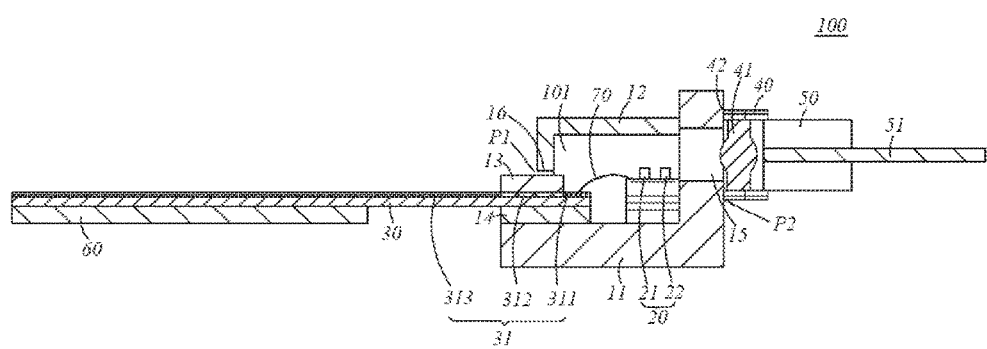
FIG. 6 shows a cross-sectional-view schematic diagram of the optical module according to an embodiment of the present disclosure.
Figure 7:
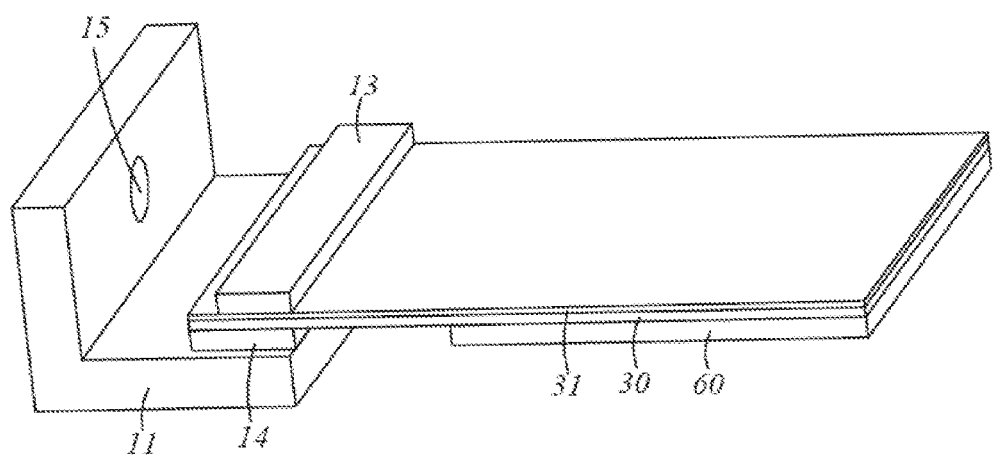
FIGS. 7-10 show different stages of a manufacturing process for an optical module according to an embodiment of the present disclosure.
Figure 8:
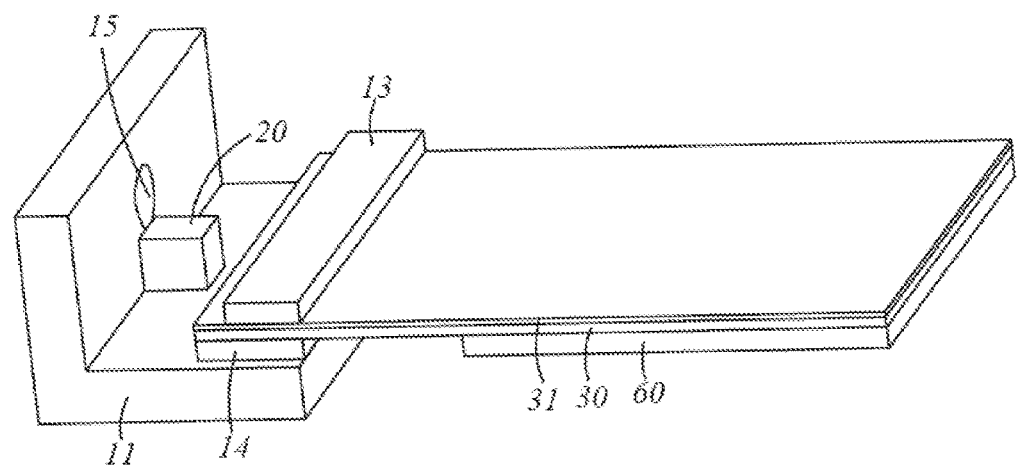
Figure 9:
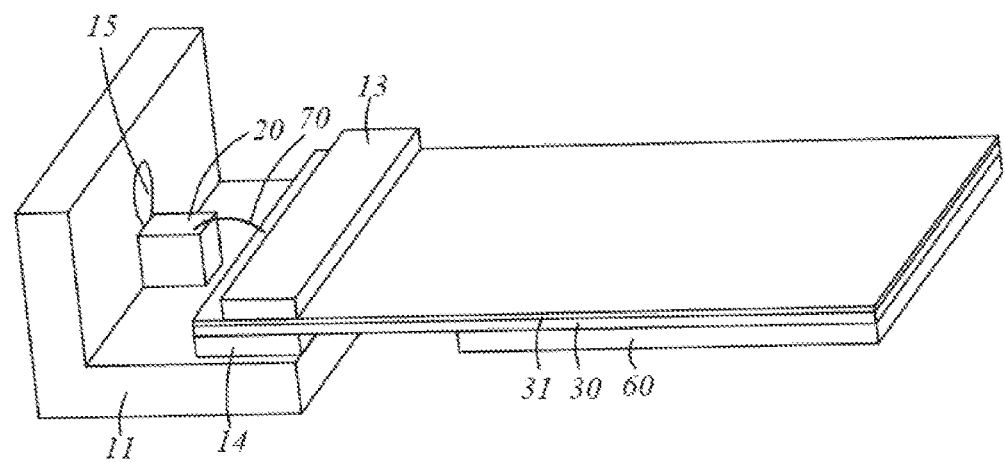
Figure 10:
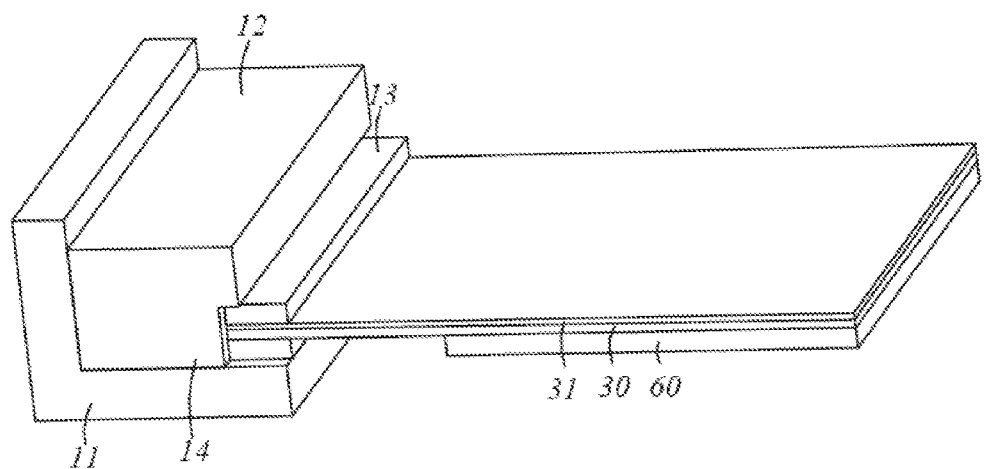

In another embodiment, as shown in FIG. 5 and FIG. 6, the same components are signified by the same numbers as in the embodiment above, and details will not be repeated for the portion that is the same as in the embodiment above. The circuit board 30 may comprise a high-speed link layer 31. The high-speed link layer 31 may be located in the same routing layer of the circuit board 30, and the high-speed link layer 31 can be used to transmit high-speed signals to the optical assembly 20. It should be noted here that when the circuit board interface 16 is directly welded to the upper and lower surfaces of the circuit board 30, the welding process may damage the routing layer on the surface of the circuit board 30.

As shown in FIG. 6, the high-speed link layer 31 may be located on the surface of the circuit board 30. Specifically, the high-speed link layer 31 may include a first link layer 31, a second link layer 312, and a third link layer 313, which can correspond to the first area 301, the second area 302, and the third area 303, respectively. The circuit board 30 may transmit the high-speed signals from the third link layer 313 to the first link layer 311 over the shortest transmission distance, and then the first link layer 311 may transmit the high-speed signals to the optical assembly 20. The high-speed signals may travel over the shortest distance in the transmission from the third link layer 313 to the first link layer 311, i.e., the high-speed signals from the third link layer 313 can transmit directly to the first link layer 311 without vias or welding, which may reduce reflection of the high-speed signals and improve high-speed performance. Here the second link layer 312 may be set on the upper surface of the circuit board 30, a first reinforcing layer 13 may be set between the circuit board interface 16 and the second link layer 312, and a metal layer may be set on the upper surface of the first reinforcing layer 13, which can be used for welding or sealing with adhesive with the metal case 10. The first reinforcing layer 13 can have multiple routing layers and impedance control layers to increase the high-frequency signals and avoid the impact on the high-frequency performance caused by welding on the upper surface of the first reinforcing layer 13. A second reinforcing layer 14 may be set between the circuit board interface 16 and the lower surfaces of the second area 302 and the first area 301 of the circuit board 30. The area where the second reinforcing layer 14 is set can also be corresponding to the first reinforcing layer 13. The lower surface of the second reinforcing layer 14 may have a metal layer that can be welded to the metal case 10 or sealed to it with adhesive. The second reinforcing layer 14 can be multiple layers of routing layers and/or a reinforcing area, and low-speed signals may pass through vias to an inner layer, from where they are transferred to various optical assembly 20 positions. Thus, the welding process of the circuit board interface 16 and the circuit board 30 may not impact the high-speed link layer 31. It The first reinforcing layer 13 and the second reinforcing layer 14 can also be rigid circuit boards.

Because the circuit board interface 16 may be welded to the first reinforcing layer 13 and the second reinforcing layer 14, the high-speed link layer 31 may not be damaged. The circuit board 30 with the high-speed link layer 31 may replace the ceramic component, and the metal case 10 may not need to be welded directly to the circuit board 30 so that the high-speed signal pathway on the circuit board 30 will not be damaged, i.e., high-speed signals can transmit directly in the high-speed link layer 31 located in the same routing layer without having to go through vias or welding, which may lower the cost and improve high-speed performance. The optical assembly 20 and the high-speed link layer 31 can also be connected electrically through a gold wire 70, which may further improve the high-speed performance.

Figure 11:
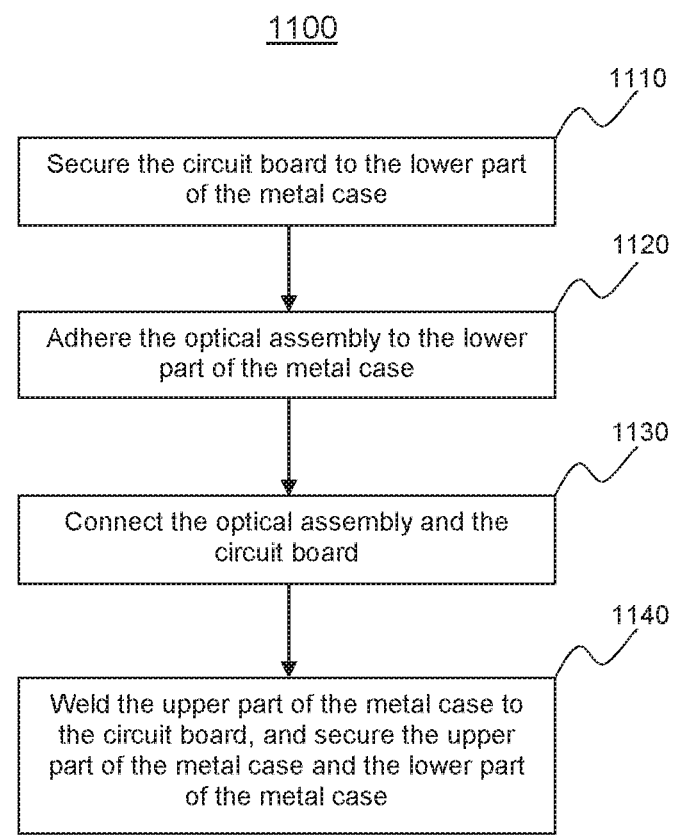
FIG. 11 shows a manufacturing process flow chart for an optical module according to an embodiment of the present disclosure.

FIGS. 7-10 show different stages of a manufacturing process for an optical module according to an embodiment of the present disclosure. FIG. 11 describes a manufacturing process 1100 for an optical module according to an embodiment of the present disclosure As shown in FIG. 11, at step 1110, the process may include securing the circuit board 30 to the lower part of the metal case 11. The circuit board 30 can be secured to the lower part of the metal case 11 through welding, adhesion, or other means. The circuit board 30 may include, in the following order, a first area 301 inside the metal case 10 for connection with the optical assembly 20, a second area 302 pressed and joined with the circuit board interface 16, and a third area 303 outside of the metal case 10 for connection with another part 60. The flexibility of the third area 303 may be greater than that of the first area 301 and second area 302. Thus, both the flexibility and the multilayer routing design of the circuit board 30 can be ensured. In addition, a second reinforcing layer 14 can be set between the circuit board 30 and the lower part of the metal case 11. The lower part of the metal case 11 can be directly secured to the second reinforcing layer 14 by means such as welding and adhering.

At step 1120, the process may include adhering the optical assembly 20 to the lower part of the metal case 1. Glue may be used to adhere the optical assembly 20 to the lower part of the metal case 11.

At step 1130, the process may include connecting optical assembly 20 to the circuit board 30. Here gold wire 70 can be used to connect the optical assembly 20 with the circuit board 30. The gold wire 70 may help ensure fast and stable transmission of high-speed signals.

At step 1140, the process may include welding the upper part of the metal case 12 to the circuit board 30, and the process may also include securing the upper part of the metal case 12 and the lower part of the metal case 11.

A first reinforcing layer 13 can be set between the circuit board 30 and the upper part of the metal case 12. In this event, the upper part of the metal case 12 can be directly secured to the first reinforcing layer 13 by means such as welding and adhering, and the upper part of the metal case 12 and the lower part of the metal case 11 may be connected and sealed with one another.

The process may also include filling the gap P1 between the circuit board interface 16 and the circuit board 30 with welding tin.

In this process, the portion on the circuit board 30 that corresponds to the circuit board interface 16 can be thinned to expose the metal medium inside, and gold or copper can be plated at the circuit board interface 16 to ensure that the welding tin is firmly attached to the metal case 10 and the circuit board 30, wherein the welding tin can be, for example, added to the circuit board interface 16 when melted with an electrical welding machine, and the welding tin fills the gap P1 between the circuit board interface 16 and the circuit board 30 to help ensure airtightness.

Below, further description of the manufacturing method for other parts of the optical module 100 is provided. It should be noted here that the following method and steps can be carried out simultaneously with the steps above rather than following a strict sequential order.

Lens 41 may be assembled in the metal sleeve tube 40. Here, for example, a die can be used to form the metal sleeve tube 40 and lens 41 as one piece. Thus, the lens 41 can be indirectly installed onto the optical module 100.

Align the connecting surface 42 on the axial direction of the metal sleeve tube 40 around the light exit opening 15 of the metal case 10, and secure with welding. The welding position P2 of the metal case 10 and metal sleeve tube 40 can be located at the outer edge of the connecting portion of the metal sleeve tube 40 and metal case 10. The welding here can be, for example, high-precision welding with a laser welder or electric resistance welder.

Apply waterproof adhesive to the welding position P2 of the metal sleeve tube 40 and metal case 10. The welding position P2 here refers to the aforementioned outer edge of the connecting portion of the metal sleeve tube 40 and metal case 10. Once the waterproof adhesive is hardened, it can help ensure the stability of the connection between the metal sleeve tube 40 and metal case 10, and it can effectively prevent outside vapor from eroding the welding position P2 or entering into the metal case 10 through the welding position.

Place the optical fiber 51 into the optical fiber sleeve tube 50, and set the optical fiber tube 50 in the metal sleeve tube 40; adjust the position of the optical fiber sleeve tube 50 for better coupling of the light into the optical fiber 51;

Here the inner diameter of the metal sleeve tube 40 may be set slightly larger than the outer diameter of the optical fiber sleeve tube 50 in order to help ensure that the optical fiber sleeve tube 50 can move back and forth in the metal sleeve tube 50 for the purpose of adjusting the position of the optical fiber 51 for better coupling of the light into the optical fiber 51.

Weld and secure the metal sleeve tube 40 and optical fiber sleeve tube 50 to one another.

Through the aforementioned embodiment, this present disclosure may provide the following benefits. The technologies and designs of the present disclosure may lower the difficulty and cost of manufacturing by using the metal case to package the optical assembly and part of the circuit board. Additionally, the same routing layer on the circuit board may be the high-speed link layer, and the transmission of high-speed signals can be realized without going through vias or employing welding techniques, lowering the level of difficulty in manufacturing and improving the high-speed performance. By designing the circuit board with different numbers of layers, multilayer design may be realized while the flexibility is ensured.

The technologies and designs of the present disclosure may realize alignment between the lens and the light exit opening on the metal case by setting the lens in the metal sleeve tube and then connecting the metal sleeve tube with the metal case, which may help ensure that the optical path of the optical module is allowed to pass through the lens. At the same time, the metal sleeve tube and metal case can be secured and connected to one another by means of welding, thus reducing the difficulty level of the technique and lowering the manufacturing cost of the optical module.

In addition, the technologies and designs of the present disclosure may enable better adjustment of the position of the optical fiber relative to the lens by designing the optical fiber sleeve tube in such a way that it can move along the metal sleeve tube, which may enable the light to be better coupled into the optical fiber.

It should be understood that despite the descriptions of embodiments in the present disclosure, there is not only one independent technical design for each embodiment. Those skilled in the art should treat the present disclosure as a whole. The technical designs in various embodiments may be combined in appropriate ways to form other embodiments.

The detailed descriptions are not to be construed as limiting the scope of protection for the present disclosure. All equivalent embodiments or changes that are not detached from the techniques of the application in essence should fall under the scope of protection of the present disclosure.

What is claimed is:

1. An optical module, comprising:
   a case;
   an optical assembly arranged in the case;
   a circuit board interface on the case; and
   a circuit board attached to the case through the circuit board interface,
   wherein the circuit board includes a first area configured to electrically connect the circuit board to the optical assembly, and a second area configured to secure the circuit board to the circuit board interface, and
   wherein the circuit board comprises:
      a flexible board including a flexible substrate, electrical components, and a metal layer at a portion that corresponds to the circuit board interface on the case, the flexible board extends through the circuit board interface and is welded to the circuit board interface through the metal layer; and
      a rigid board connected to the flexible board at a location outside the case, and
   wherein the second area includes at least one reinforcing layer, and the circuit board interface is welded to the at least one reinforcing layer.

2. The optical module of claim 1, wherein the at least one reinforcing layer is arranged on an upper surface of the flexible board, the rigid board is arranged on a lower surface of the flexible board, and the upper surface of the flexible board is a high-speed link layer for high-speed signal transmission.

3. The optical module of claim 2, wherein the at least one reinforcing layer includes at least one first reinforcing layer, the optical module further including a second reinforcing layer arranged at a location of the lower surface that corresponds to the at least one first reinforcing layer.

4. The optical module of claim 3, wherein the metal layer is a first metal layer, the optical module further including a second metal layer arranged on the at least one first reinforcing layer and configured to weld onto the case.

5. The optical module of claim 1, wherein the circuit board includes an adhesive sealant configured to seal the circuit board to the circuit board interface.

6. The optical module of claim 5, wherein the case comprises an upper part and a lower part, and the upper part of the case and the lower part of the case are sealed together.

7. An optical module manufacturing method, comprising:
   attaching a circuit board to a lower part of case, wherein the circuit board includes a first area, a second area, and a third area, and wherein the third area of the circuit board has a greater flexibility compared to the first area of the circuit board and the second area of the circuit board;
   attaching an optical assembly to the lower part of the case;
   connecting the optical assembly to the first area of the circuit board;
   joining a circuit board interface to the second area of the circuit board;
   welding an upper part of the case to the circuit board, and securing the upper part of the case and the lower part of the case together.

* * * * *